(12) United States Patent
Hanna et al.

(10) Patent No.: US 7,399,426 B2
(45) Date of Patent: Jul. 15, 2008

(54) LIQUID CRYSTALLINE ORGANIC SEMICONDUCTOR MATERIAL AND ORGANIC SEMICONDUCTOR STRUCTURE USING THE SAME

(75) Inventors: Junichi Hanna, Yokohama (JP); Hiroki Maeda, Tokyo-To (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 369 days.

(21) Appl. No.: 11/081,783

(22) Filed: Mar. 16, 2005

(65) Prior Publication Data

US 2005/0224755 A1 Oct. 13, 2005

(30) Foreign Application Priority Data

Mar. 29, 2004 (JP) .............................. 2004/095390

(51) Int. Cl.
- *C09K 19/52* (2006.01)
- *C09K 19/54* (2006.01)
- *H01L 29/08* (2006.01)
- *G02F 1/13* (2006.01)

(52) U.S. Cl. .............................. 252/299.01; 252/299.5; 257/40; 349/2

(58) Field of Classification Search ................... 257/40; 428/1.1, 1.3; 252/299.01, 299.3, 299.5; 349/2

See application file for complete search history.

(56) References Cited

U.S. PATENT DOCUMENTS

| 5,370,820 A | * | 12/1994 | Boden et al. ............ 252/299.01 |
| 2002/0094390 A1 | * | 7/2002 | Sato et al. ..................... 428/1.1 |
| 2004/0201011 A1 | * | 10/2004 | Sakurada et al. .............. 257/40 |

FOREIGN PATENT DOCUMENTS

JP 2004346295 * 9/2004

OTHER PUBLICATIONS

English translation by computer for JP 2004-346295, http://www4.ipdl.inpit.go.jp/Tokujitu/PAJdetail.ipdl?N0000=60&N0120=01&N2001=2&N3001=2004-346295.*

* cited by examiner

*Primary Examiner*—Shean C Wu
(74) *Attorney, Agent, or Firm*—Burr & Brown

(57) ABSTRACT

There is provided a liquid crystalline organic semiconductor material that can effectively develop electron conductive properties which a liquid crystal system inherently has. The liquid crystalline organic semiconductor material has both an isotropic phase and a smectic liquid crystal phase and comprises an electronically conductive liquid crystal material, wherein the concentration of an impurity in the liquid crystal material is controlled to a lower value than the critical concentration at which the electron conductivity of the liquid crystal material disappears or is significantly reduced rendering ion conduction dominant.

9 Claims, 3 Drawing Sheets

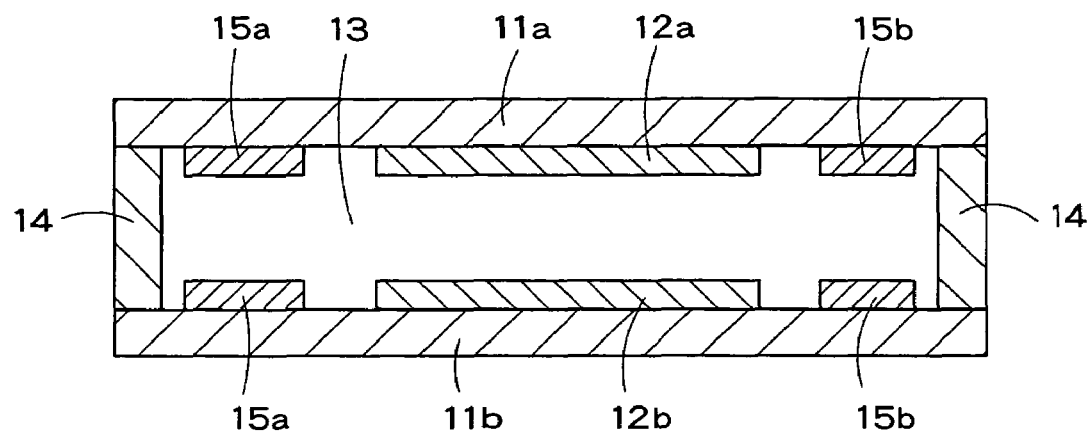
F I G. 1
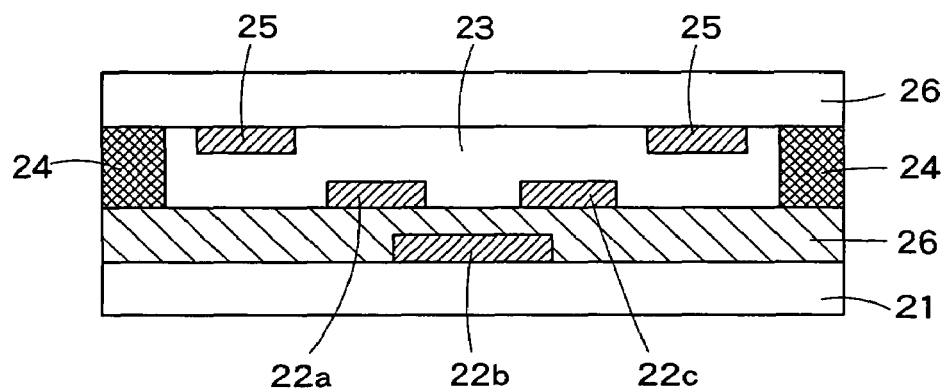
F I G. 2
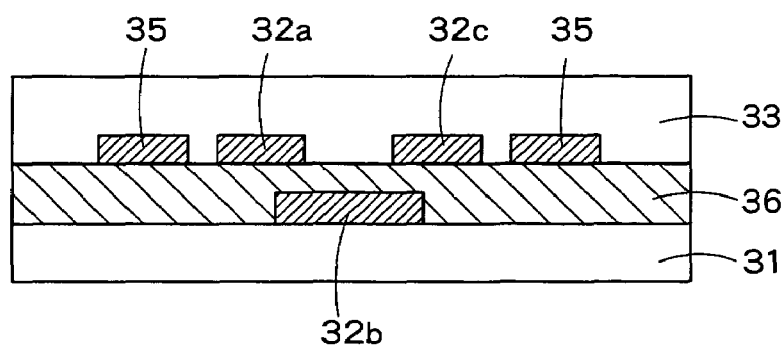
F I G. 3

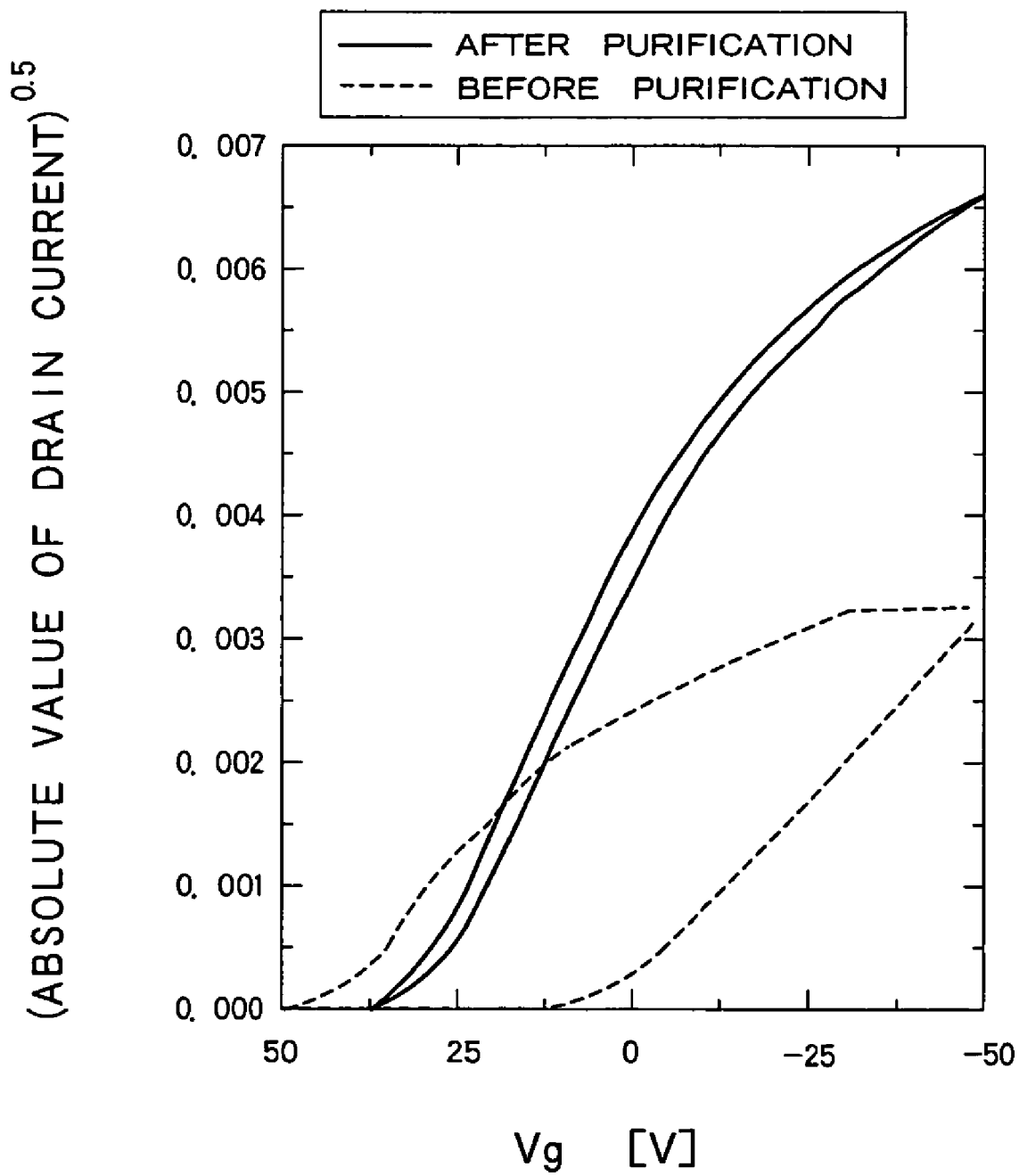
F I G. 6

LIQUID CRYSTALLINE ORGANIC SEMICONDUCTOR MATERIAL AND ORGANIC SEMICONDUCTOR STRUCTURE USING THE SAME

TECHNICAL FIELD

The present invention relates to an organic semiconductor material, particularly a liquid crystalline organic semiconductor material having electronically conductive action.

BACKGROUND OF THE INVENTION

In recent years, various information recording media such as magnetic recording media, thermal recording media, and optical recording media have been developed and put to practical use. Up to now, the present inventors have made studies on optical, physicochemical or electrical properties of liquid crystal materials and have proposed liquid crystalline charge transport materials in which attention has been focused on charge transport properties of specific liquid crystal systems (for example, Japanese Patent Application No. 76820/1998). These liquid crystalline charge transport materials are utilizable as organic semiconductors.

SUMMARY OF THE INVENTION

Various liquid crystalline charge transport materials in which attention has been focused on charge transport properties (electronically conductive action) of liquid crystal systems have hitherto been proposed. According to the present inventor's finding, however, when the charge transport materials are actually applied to useful information recording devices (such as photoconductor drums of copying machines) or organic semiconductor structures (such as organic electro luminescent or organic transistors), electronically conductive properties which liquid crystal systems inherently have are delicately influenced, for example, by unavoidable impurities present in constituent materials and secondary contamination from surrounding environment.

The present invention has been made based on the above finding, and an object of the present invention is to provide an information recording medium as a photoconductor (a material of which the conductivity is enhanced by migration of charges, produced upon light irradiation, by an electric field) which can effectively develop electronically conductive properties inherently possessed by liquid crystal systems, a liquid crystalline organic semiconductor material suitable for organic semiconductor structures, and a process for producing the same. Further, the present invention provides an information recording medium as a photoconductor comprising this liquid crystalline organic semiconductor material, and organic semiconductor element and structure.

The above object can be attained by a liquid crystalline organic semiconductor material comprising a liquid crystalline charge transport material which has both an isotropic phase and a smectic liquid crystal phase and is electronically conductive, characterized in that the concentration of an impurity in said organic semiconductor material is controlled to a lower value than the critical concentration at which the electron conductivity of the organic semiconductor material disappears or is significantly reduced rendering ion conduction dominant. In other words, the liquid crystalline charge transport material can be said to be a liquid crystalline organic semiconductor material having both an isotropic phase and a smectic liquid crystal phase and comprising an electronically conductive liquid crystal material, characterized in that the concentration of an impurity in said organic semiconductor material is controlled to a lower value than the critical concentration at which the ion conduction attributable to the impurity is more dominant than the above electronically conductive properties.

The term "liquid crystalline organic semiconductor material" as used herein refers to a material having at least one liquid crystal phase which can be used in a liquid crystal state, as well as in a higher order coagulated state.

In a preferred embodiment of the present invention, the above impurity concentration is not more than 1 ppm.

Further, in a preferred embodiment of the present invention, the above impurity comprises an electrophoretic component (for example, thiophene).

The process for producing a liquid crystalline organic semiconductor material according to the present invention is characterized in that, in producing an organic semiconductor material having both an isotropic phase and a smectic liquid crystal phase and comprising an electronically conductive liquid crystal material, the concentration of an impurity in said liquid crystal material is controlled by electrophoresis to a value below a given range.

In a preferred embodiment of the production process of a liquid crystalline organic semiconductor material according to the present invention, the process comprises the step of: in controlling the impurity concentration of the organic semiconductor material (in a drive path) to a value below the given range, sweeping the impurity contained in the organic semiconductor material by electrophoresis in such a state that said liquid crystal material is in an isotropic phase, and, subsequently, transiting the phase to a liquid crystal phase or a higher order coagulated state, whereby the concentration of the impurity in said organic semiconductor material is controlled to a lower value than the critical concentration at which the electron conductivity of the organic semiconductor material disappears or is significantly reduced rendering ion conduction dominant.

Further, in a preferred embodiment of the production process of a liquid crystalline organic semiconductor material according to the present invention, the process comprises the step of sweeping the impurity by the electrophoresis while photoexciting said organic semiconductor material.

According to the present invention, there is provided an information recording element comprising a photoconductor comprising a pair of electrodes and the above liquid crystalline charge transport material filled into a gap between said electrodes.

In a preferred embodiment of the information recording element according to the present invention, the information recoding element further comprises electrodes for electrophoresis.

According to the present invention, there is provided an organic semiconductor element comprising an organic semiconductor comprising a pair of electrodes and the above liquid crystalline charge transport material filled into a gap between said electrodes.

In a preferred embodiment of the information recording element according to the present invention, the organic semiconductor structure further comprises electrodes for electrophoresis.

Thus, in the liquid crystalline organic semiconductor material according to the present invention, electronically conductive properties inherently possessed by liquid crystal systems can be significantly improved by removing the concentration of an impurity by electrophoresis to a given critical value or less in a rapid and simple manner.

According to the present invention, control of the concentration of unavoidable impurities present in the constituent materials and an impurity attributable to secondary contamination from surrounding environment or the like to a given level or less can provide a liquid crystalline charge transport material suitable in an information recording medium and an organic semiconductor structure as a photoconductor and an organic semiconductor, which can effectively develop electronically conductive properties inherently possessed by liquid crystal systems, and a process for producing the same, and an information recording medium as a photoconductor comprising the above liquid crystalline charge transport material.

BRIEF DESCRIPTION OF THE DRAWINGS

FIG. 1 is a cross-sectional view showing the construction of an information recording medium in one embodiment of the present invention;

FIG. 2 is a cross-sectional view showing the construction of an information recording medium in one embodiment of the present invention;

FIG. 3 is a cross-sectional view showing the construction of an information recording medium in one embodiment of the present invention;

FIG. 6 is a graph showing current-voltage characteristics in Examples of the present invention and Comparative Examples.

DETAILED DESCRIPTION OF THE INVENTION

Figure 4:
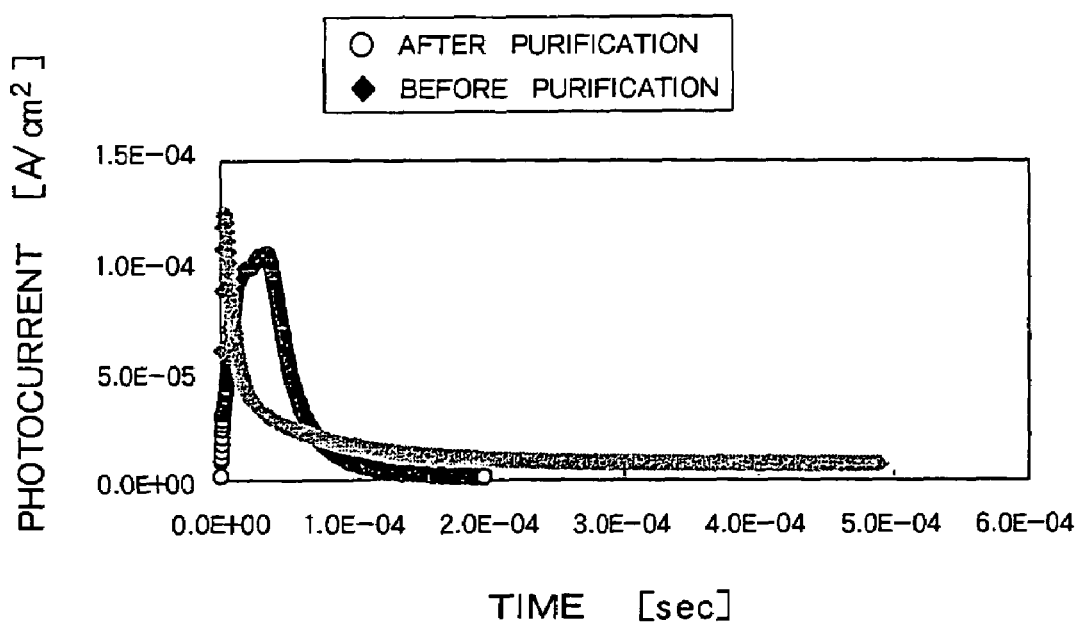
FIG. 4 is a graph showing electronically conductive properties in Examples of the present invention and Comparative Examples.

Bipolar organic semiconductor liquid crystals and bipolar photoconductive liquid crystals are preferably used as the liquid crystal material constituting the liquid crystalline organic semiconductor material according to the present invention, and specific examples of preferred liquid crystal materials include rodlike liquid crystal systems, for example, phenylnaphthalene liquid crystals such as 2-(4'-octylphenyl)-6-dodecyloxynaphthalene (abbreviated to "8-PNP-O12"), 2-(4'-octylphenyl)-6-butyloxynaphthalene (abbreviated to "8-PNP-O4"), and 10-PNP-O9, and biphenyl liquid crystals such as 2-4'-heptyloxy-4'-octylbiphenyl (abbreviated to "60-BP-8").

Further, even monopolar organic semiconductor liquid crystals and photoconductive liquid crystals can be preferably used by selecting polarity of voltage applied to electrodes to which excitation light is applied, and specific examples of preferred monopolar organic semiconductor liquid crystals and photoconductive liquid crystals include phenylbenzothiazole liquid crystals such as biphenyl liquid crystals having carbonyl and alkoxy at the terminal, for example, 2-(4'-heptyloxyphenyl)-6-dodecylthiobenzothiazole (abbreviated to "7O-PBT-S12"), 4-heptyloxy-4'-dodecylbiphenyl (abbreviated to "70-BP-CO-11"), and 4-hexyloxy-4'-butanoylbiphenyl (abbreviated to "60-BP-CO-4").

For example, 8-PNP-O12 exhibits phase transfer behavior of Cryst. −79° C.-SmB-101° C.-SmA-121° C.-Iso. In the SmB phase on the low-temperature side, both electrons and holes exhibit a mobility of $1.6 \times 10^{-3}$ cm$^2$/Vs, and, also in the 5 mA phase on the high-temperature side, the mobility is $2.5 \times 10^{-4}$ cm$^2$/Vs.

The above specific liquid crystal materials have such a property that the charge transport properties vary depending upon phase transfer caused by a temperature change between two or more plurality of stable liquid crystal phases.

The liquid crystalline organic semiconductor material according to the present invention is characterized in that the impurity concentration of the liquid crystal material is controlled to a lower concentration than the critical concentration at which the electronic conduction of the liquid crystal material disappears or is significantly reduced rendering ion conduction dominant.

In the present invention, when the impurity comprises an electrophoretic component, for example, thiophene or an ingredient corresponding to thiophene, the impurity concentration is preferably not more than 1 ppm, more preferably not more than 0.01 ppm. When the impurity concentration exceeds 1 ppm, the charge transport properties significantly change, resulting in lowered mobility which causes disappearance or a significant decrease of electronically conductive properties. This significant change in charge transport properties indicates that there is a critical point in the content of electrophoretic impurity ingredients.

The electrophoretic impurity component other than thiophene include impurities included in the course of synthesis of the liquid crystalline charge transport material or unreacted starting materials which cannot be fully removed, and ionic impurities produced in the stage of synthesis. In this case, the impurity concentration is preferably not more than 1 ppm, more preferably not more than 0.01 ppm.

Further, the production process of the liquid crystalline organic semiconductor material according to the present invention is characterized in that, in producing the organic semiconductor material, the concentration of an impurity in the liquid crystal material is controlled to a value below a given range by electrophoresis.

That is, in the process according to the present invention, the impurity concentration of the liquid crystal material is controlled skillfully to a value below a given range by electrophoresis.

It is known in the art that the purity of the organic electronic materials can be improved by recrystallization or sublimation purification. This conventional purification method, however, is not always effective in improving the function as the liquid crystalline photoconductor in the present invention. Further, even when the impurity concentration is reduced by the above purification method, during or after the production of an information recording element, in some cases, the once purified charge transport material undergoes a significant deterioration in initial properties by secondary contamination from other contamination sources or surrounding environments.

The above conventional problems can be effectively eliminated by the present invention.

In a preferred embodiment of the present invention, the above production process comprises the step of, in controlling the impurity concentration of the liquid crystal material to a value below the given range, sweeping the impurity contained in the liquid crystal material by electrophoresis in such a state that the liquid crystal material is in an isotropic phase, and, subsequently, transiting the phase to a liquid crystal phase, whereby the concentration of the impurity in said liquid crystal material is controlled to a lower value than the critical concentration at which the electron conductivity of the liquid crystal material disappears or is significantly reduced rendering ion conduction dominant.

Further, in the present invention, the impurity is preferably swept by the above electrophoresis while photoexciting the liquid crystal material. Electrophoresis under such photoexcitation is advantageous in that contaminants, which are electrically neutral but are electrified and consequently become an electrical impurity, are actively electrified by photoexcitation and can be removed by electrophoresis.

The information recording element according to the present invention comprises a photoconductor comprising a pair of electrodes and the above liquid crystalline charge transport material filled into a gap between the electrodes. In a further preferred embodiment, the information recording element further comprises electrodes for electrophoresis.

The organic semiconductor element according to the present invention comprises an organic semiconductor comprising a pair of electrodes and the above liquid crystalline organic semiconductor material filled into a gap between the electrodes. In a further preferred embodiment, the organic semiconductor element further comprises electrodes for electrophoresis.

FIG. 1 is a cross-sectional view of one embodiment of the information recording element according to the present invention. This information recording element comprises a pair of substrates 11a and 11b, electrodes 12a and 12b provided respectively on the substrates 11a and 11b, and the above liquid crystalline charge transport material 13 filled into a gap provided between the electrodes 12a and 12b through a spacer 14.

Preferably, at least one of the substrates 11a and 11b is formed of a light transparent material such as glass. The material, however, is not particularly limited. The electrodes provided on the substrates are preferably transparent electrodes such as ITO (indium tin oxide). The pair of substrates constituting the cell of the information recording medium are joined to and integrated with each other through a spacer 14 by means of fixation means such as an adhesive, and a liquid crystal material is filled into the formed gap. Further, in the information recording element in this embodiment, a pair of electrodes 15a for electrophoresis are formed at one end of respective both surfaces of the substrates, and a pair of electrodes 15b for electrophoresis are formed at the other end of respective surfaces of the substrates. In this case, either the electrode 15a or the electrode 15b is connected to a positive electrode or a negative electrode, and the impurity can be swept under predetermined electrophoretic conditions. Thus, in the information recording element in the above embodiment, since electrodes for electrophoresis are formed in each information recording element, in using the recording element, the impurity can be previously rapidly removed by electrophoresis and, thus, the electronically conductive properties of the liquid crystal material can be utilized maximally.

For example, in the information recording medium shown in FIG. 1, upon the application of a laser beam through any one of the substrates, thermal energy is applied to a part of or the whole of the area of the cell, and, consequently, phase transition corresponding to thermal energy applied to the liquid crystal material layer or a change in domain structure due to the phase transition occurs, resulting in a change in charge transport properties according to this transition phase. The domain structure in the transition phase is stable so far as thermal energy is not applied to the same site on such a level that transition to an isotropic phase occurs. Thus, unique information can be recorded.

On the other hand, the magnitude of photocurrent produced by charges injected by the application of light (for example, pulsed light as trigger) to an information recording part is determined by charge transport properties of the applied site. Therefore, information can be read by detecting the quantity of photocurrent as current values from the electrode.

FIGS. 2 and 3 each are a cross-sectional view of one embodiment of the organic semiconductor element according to the present invention. This organic semiconductor element includes an organic transistor element. The organic transistor element comprises a substrate 21 provided with a gate electrode 22b, a gate insulating layer 26, a source electrode 22a, and a drain electrode 22c. The organic transistor element further comprises a substrate as a sealing layer 26. A gap is provided between the substrate 21 and the sealing layer 26 through a spacer 24, and the above liquid crystalline organic semiconductor material 23 is held in the gap. A pair of purification electrodes 25 is arranged around the organic transistor element. Alternatively, the organic transistor element may have the following construction. Specifically, the organic transistor element includes a substrate 31 provided with a gate electrode 32b, a gate insulating layer 36, a source electrode 32a, a drain electrode 32c, and the liquid crystalline organic semiconductor layer 33. On the substrate 31 at its position around a site which functions as an organic transistor element is disposed a pair of purification electrodes 35. In this embodiment, in using the organic semiconductor element, the impurity can be previously rapidly removed by electrophoresis, and the electronically conductive properties of the liquid crystalline organic semiconductor material can be utilized maximally.

EXAMPLES

The following Examples further illustrate the present invention.

Example 1

(Production Example)

Glass substrates (10×10 mm) each provided with ITO as a transparent electrode were disposed so as to face each other while providing a gap of 10 µm using a polyimide sheet as a spacer, and the spacing between both the substrates was fixed by a thermosetting resin to form a sandwich cell as shown in FIG. 1, and a liquid crystalline charge transport material (8-PNP-O12) was poured in an isotropic phase (150° C.) into the sandwich cell by taking advantage of a capillary phenomenon. The concentration of an impurity component (thiophene) in the liquid crystalline charge transport material at the time of pouring was 100 ppm.

Subsequently, the impurity was removed by electrophoresis under the following electrophoretic conditions.

(Conditions for Electrophoresis Purification)

Distance between electrophoresis electrodes: 10 mm

Conditions for voltage application: Application of 1000 V DC to the liquid crystalline charge transport material in isotropic phase (150° C.) for 30 min while photoexcitation. While holding the voltage application, cooling to liquid crystal phase (5 mA phase: 110° C.).

The impurity concentration after the electrophoresis was not more than 1 ppm.

Subsequently, excitation light (nitrogen pulse laser) was used to adjust the pulse width to 600 ps and the output to a constant value in terms of total charge quantity, and the transient photocurrent was measured under maximum value 4 µJ/pulse and applied voltage 100 V (10 V/µm).

For comparison, measurement was also carried out for the case where electrophoresis purification was not carried out.

Figure 5:
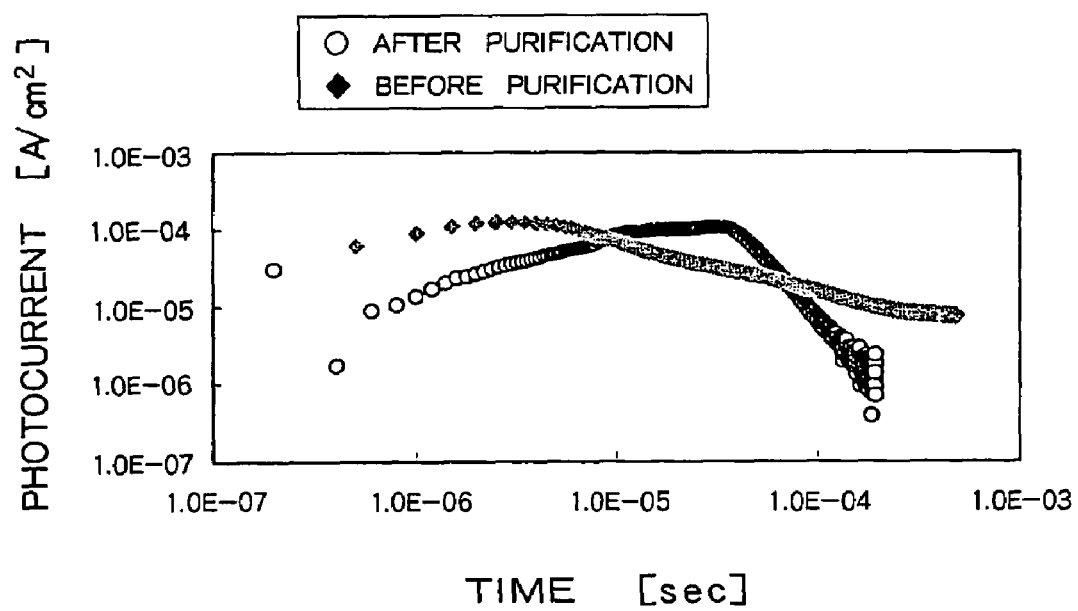
FIG. 5 is a graph showing electronically conductive properties in Examples of the present invention and Comparative Examples.

The electronically conductive properties are shown in FIGS. 4 and 5. The results in these drawings show that an inflexion point appears upon a change in photocurrent with the elapse of time for the case where electrophoresis purification was carried out. The presence of this inflexion point indicates the development of good mobility. That is, it is observed that charge transport properties (charge mobility) are given from the time when the inflexion point of the current value appears. On the other hand, it is apparent that, in the example in which the impurity concentration is 100 ppm, this inflexion point does not occur and the electronically conductive properties are not developed.

Example 2

(Production Example)

A gate insulating layer (thickness 1 μm) of polyimide was formed on a glass substrate provided with 50 nm-thick Ta formed as a gate electrode by mask sputtering, and patterned film formation of 50 nm-thick Au as source and drain electrodes through a metal mask was carried out in a channel length of 50 μm and a channel width of 2.5 mm. A separate one substrate provided with a pair of Au purification electrodes with a thickness of 150 nm formed so as to be adjacent to the channel formation part in a width of 1 mm was provided and was disposed so as to face the above substrate through a polyimide sheet as a spacer while providing a space of 10 μm between the two substrates. The spacing between both the substrates was fixed by a thermosetting resin to form a structure as shown in FIG. 2. A liquid crystalline organic semiconductor (8-TTP-8) was poured in an isotropic phase (100° C.) into the structure by taking advantage of a capillary phenomenon. The impurity concentration estimated from the magnitude of a dark current attributable to the impurity component in the liquid crystalline organic semiconductor at the time of pouring was not less than 10 ppm. Subsequently, electrophoresis was carried out under the following electrophoresis conditions to remove the impurity.

(Conditions for Electrophoresis Purification)

Distance between electrophoresis electrodes: 1 mm

Conditions for voltage application: Application of 100 V DC to the liquid crystalline organic semiconductor in isotropic phase (100° C.) for 30 min. While holding the voltage application, cooling to liquid crystal phase (SmG phase: 65° C.). The impurity concentration estimated from dark conduction between source and drain after electrophoresis was about 1 ppm.

Subsequently, while applying a given voltage (−50 V) across the source and the drain, the gate voltage was swept in a range of ±50 V, and the behavior of modulation of the drain current by the gate voltage was measured.

For comparison, measurement was also carried out for the case where electrophoresis purification was not carried out.

The current-voltage characteristics thus obtained are shown in FIG. 6. The results in the drawing show that, for the example in which electrophoresis purification was carried out, rapid drain current modulation was observed independently of the sweeping direction of the voltage. The charge mobility and threshold voltage Vth as determined by the calculation method in the saturated region in the organic transistor were 0.05 cm$^2$/Vs and about 30 V, respectively.

On the other hand, for the example in which electrophoresis purification was not carried out (impurity concentration: corresponding to 10 ppm), it was observed that significant hysteresis occurred depending upon the voltage sweeping direction and, unlike the Example, the charge mobility per se was lowered to $1 \times 10^{-3}$ cm$^2$/Vs. The occurrence of significant hysterisis in the Comparative Example is considered to be attributable to the reflection of migration of the ionic impurity in the material between the source and drain electrodes during operation of the organic transistor. It is considered that, in the electrophoresis purification, since the ionic migration component was removed from the channel formation region during drive of the organic transistor, good drain current modulation is observed independently of the voltage sweeping direction. In the Comparative Example, the migration impurity present in the element channel region inhibits the charge transport capability inherent in the organic semiconductor material, and, thus, the charge mobility as determined in the same manner as in the Example is still $1 \times 10^{-3}$ cm$^2$/Vs.

The invention claimed is:

1. A liquid crystalline organic semiconductor material having both an isotropic phase and a smectic liquid crystal phase and comprising an electronically conductive liquid crystal material, wherein the concentration of an impurity in the liquid crystal material is controlled to a lower value than the critical concentration at which the electron conductivity of the liquid crystal material disappears or is significantly reduced rendering ion conduction dominant, wherein the impurity comprises an electrophoretic component, and wherein the impurity concentration is not more than 1 ppm.

2. The liquid crystalline organic semiconductor material according to claim 1, wherein said impurity is thiophene.

3. A process for producing a liquid crystalline organic semiconductor material, wherein, in producing an organic semiconductor material having both an isotropic phase and a smectic liquid crystal phase and comprising an electronically conductive liquid crystal material, the concentration of an impurity in the liquid crystal material is controlled by electrophoresis to a value below a given range.

4. The process according to claim 3, wherein, in controlling the impurity concentration of the liquid crystalline organic semiconductor material to a value below the given range, the impurity contained in the organic semiconductor material is swept by electrophoresis in such a state that the organic semiconductor material is in an isotropic phase, and, subsequently, the phase is transited to a liquid crystal phase or a higher order coagulated state, whereby the concentration of the impurity in the organic semiconductor material is controlled to a lower value than the critical concentration at which the electron conductivity of the organic semiconductor material disappears or is significantly reduced rendering ion conduction dominant.

5. The process according to claim 4, wherein the impurities are swept by the electrophoresis while photoexciting the organic semiconductor material.

6. An organic semiconductor structure comprising a pair of electrodes and the liquid crystalline organic semiconductor material according to claim 1 filled into a gap between the electrodes.

7. The organic semiconductor structure according to claim 6, further comprising second electrodes for electrophoresis.

8. An information recording medium comprising a pair of electrodes and the liquid crystalline organic semiconductor material according to claim 1 filled into a gap between the electrodes.

9. The information recording medium according to claim 8, further comprising second electrodes for electrophoresis.

* * * * *